United States Patent [19]

van de Stadt

[11] Patent Number: 5,030,839

[45] Date of Patent: Jul. 9, 1991

[54] METHOD AND APPARATUS FOR MEASURING BODY TO LEAD TOLERANCES OF VERY ODD COMPONENTS

[75] Inventor: Arend van de Stadt, Ossining, N.Y.

[73] Assignee: North American Philips Corporation, New York, N.Y.

[21] Appl. No.: 450,331

[22] Filed: Dec. 13, 1989

[51] Int. Cl.⁵ .......................................... G01N 21/86
[52] U.S. Cl. ................................... 250/561; 356/375
[58] Field of Search ................. 250/561, 223 R, 221, 250/222.1; 356/375; 901/47

[56] References Cited

U.S. PATENT DOCUMENTS

| | | | |
|---|---|---|---|
| 4,147,930 | 4/1979 | Browne et al. | 250/223 R |
| 4,264,202 | 4/1981 | Gugliotta et al. | 250/561 |
| 4,319,845 | 3/1982 | Shuji | 356/375 |
| 4,453,085 | 6/1984 | Pryor | 250/561 |
| 4,553,843 | 11/1985 | Langley et al. | 250/561 |
| 4,598,456 | 7/1986 | McConnell | 29/407 |
| 4,628,464 | 12/1986 | McConnell | 356/375 |
| 4,654,964 | 4/1987 | Schneider et al. | 29/705 |
| 4,821,157 | 4/1989 | Birk et al. | 362/247 |
| 4,862,510 | 8/1989 | Duncan et al. | 250/561 |

FOREIGN PATENT DOCUMENTS

| | | |
|---|---|---|
| 0301255 | 2/1989 | European Pat. Off. . |
| 3823836 | 1/1990 | Fed. Rep. of Germany . |
| 3929478 | 2/1990 | Fed. Rep. of Germany . |

OTHER PUBLICATIONS

V. DiLorenzo et al, "Component Position Recognition Method and Device for an Assembly Robot", IBM TDB, vol. 26, #7B (12/83) pp. 3664-3666.

Primary Examiner—David C. Nelms
Attorney, Agent, or Firm—Anne E. Barschall

[57] ABSTRACT

An improved sensor for body-to-lead tolerances for very odd components includes multiple light beams formed by LED/photodiode pairs, or multiple independent light detectors with a multidirectional light source. The sensor is self-contained, not requiring position data from a robot carrying the components.

23 Claims, 7 Drawing Sheets

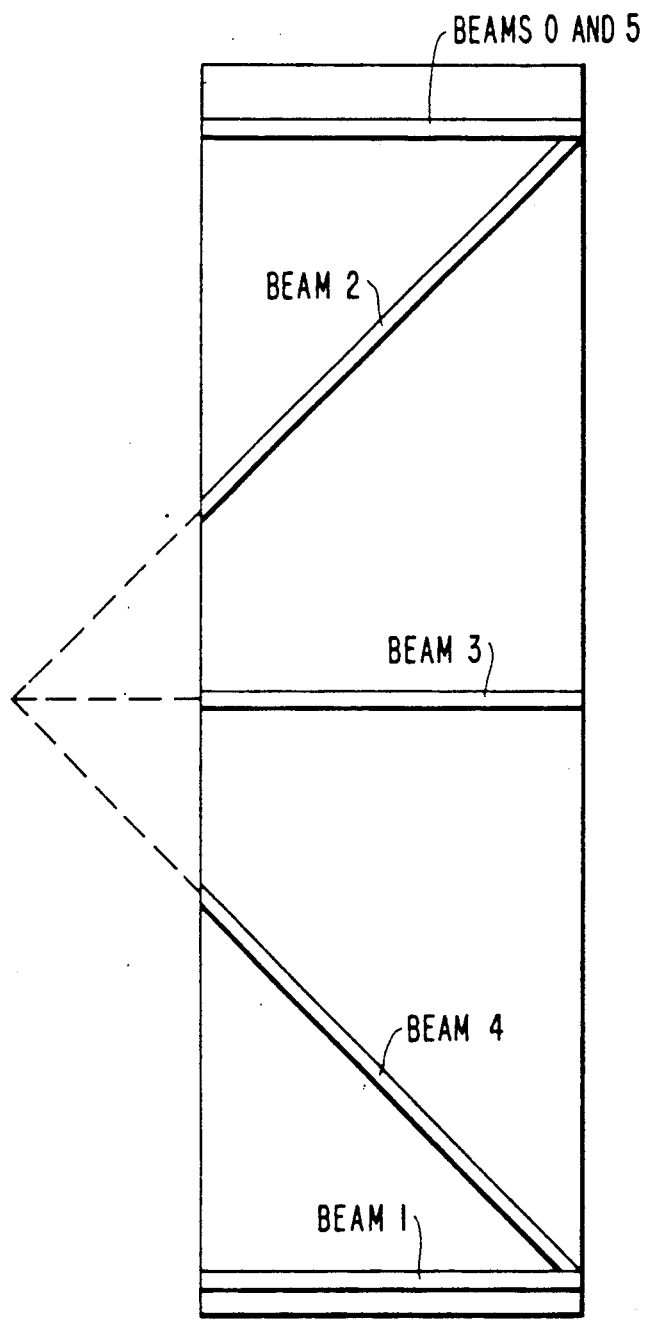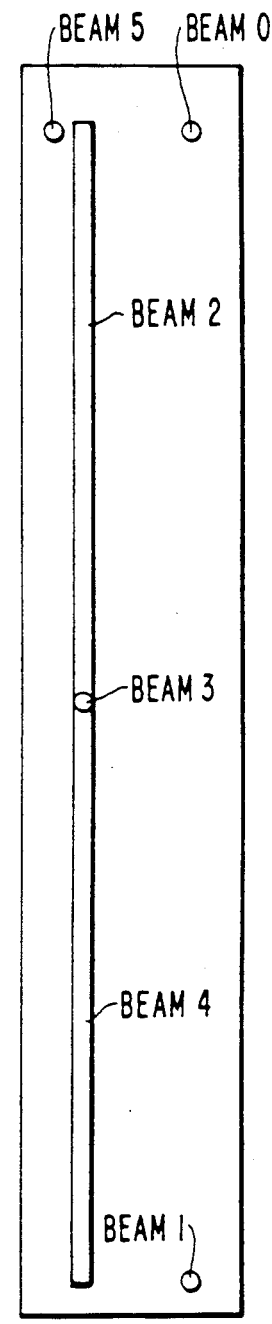

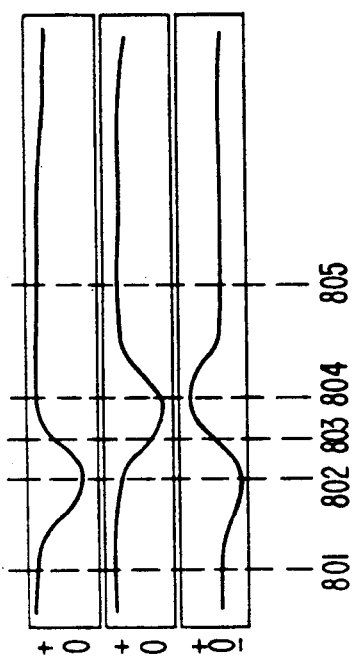
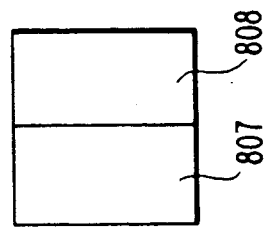
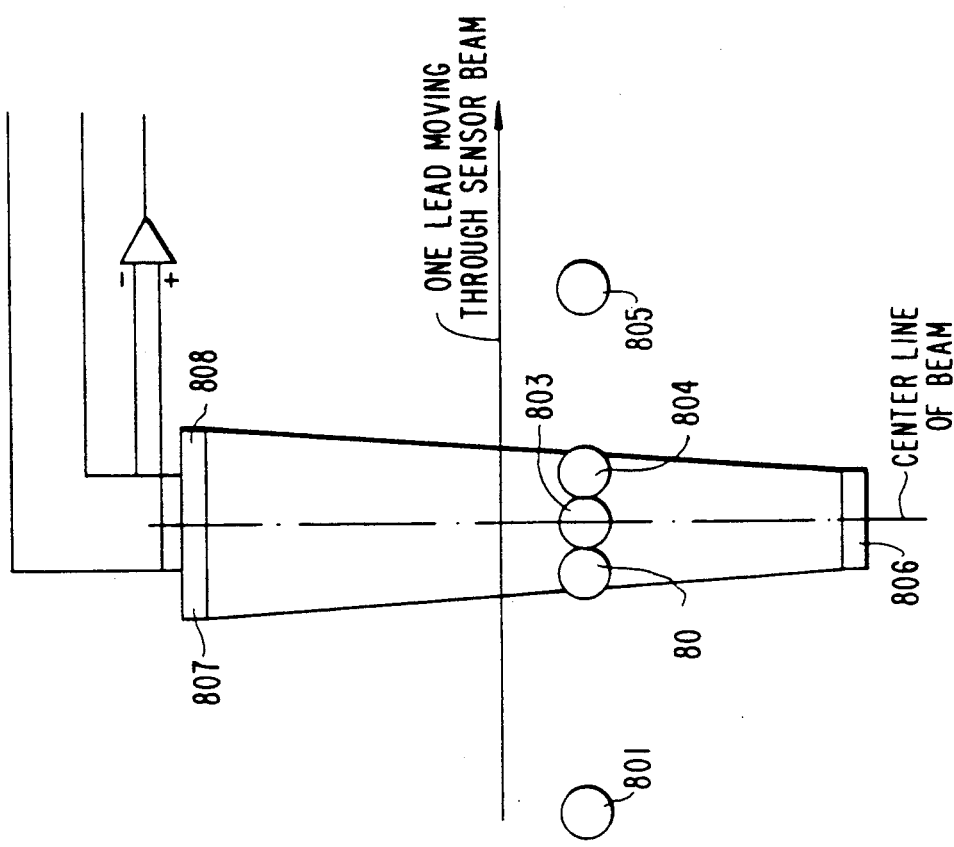

METHOD AND APPARATUS FOR MEASURING BODY TO LEAD TOLERANCES OF VERY ODD COMPONENTS

BACKGROUND OF THE INVENTION

1.1 Field of the Invention

The invention relates to an improved apparatus for measuring body to lead tolerances of very odd components ("VOCs").

1.2 Related Art

When VOCs are inserted automatically into a printed circuit board, a gripper holds the body of the component. However, at the moment of insertion, the leads have to be at the right location. The controller for the gripper knows where the leads should be; but, if the lead locations differ too much from the "ideal" component, the insertion will fail. Automatic insertion requires an accurate measurement of the body-to-lead tolerance.

FIG. 1 illustrates a known system for measuring body to lead tolerances. In the known apparatus a robot moves a VOC through feedthrough area 101. The leads of the VOC interrupt laser-light beams 102 and 103. Laser-light beams 102 and 103 come from laser 106, via mirror 107, and semi-transparent mirror IOS. The interruptions are detected in the photocells 104 and 105. Based on the interruptions, positions of the leads are calculated.

The known system has the disadvantage that there may be occlusions between leads. The known system has the further disadvantage that a laser is needed. The known system is also not self-contained. It requires input from the gripper controller. In addition, improved cost, speed, and accuracy are needed.

SUMMARY OF THE INVENTION

An object of the invention is to provide increased redundancy in measuring body to lead tolerances, in order to achieve higher accuracy and in order to be able to measure more complex lead patterns.

A further object of the invention is to obviate the need for a laser in measuring body to lead tolerances.

It is still a further object to have a self-contained sensor, which does not need input from the controller of the robot which is moving the VOC.

Redundancy is achieved in that at least two independent light beams or more than two independent light detectors are used.

In one embodiment, light beams are produced by LED's rather than lasers.

The self-containment comes from the fact that the position of the robot is measured by using the same sensor which detects lead positions, rather than by using the robot controller.

BRIEF DESCRIPTION OF THE DRAWING

The invention will now be described by way of non-limitative example with reference to the following drawings.

FIG. 7 is another alternate beam layout according to the invention.

FIG. 8a shows a top view of measurement of a lead location using a dual dell diode.

FIG. 8b shows signals resulting from the locations of FIG. 8a.

FIG. 8c shows a front view of the dual cell diode.

DETAILED DESCRIPTION OF THE PREFERRED EMBODIMENTS

Figure 1:
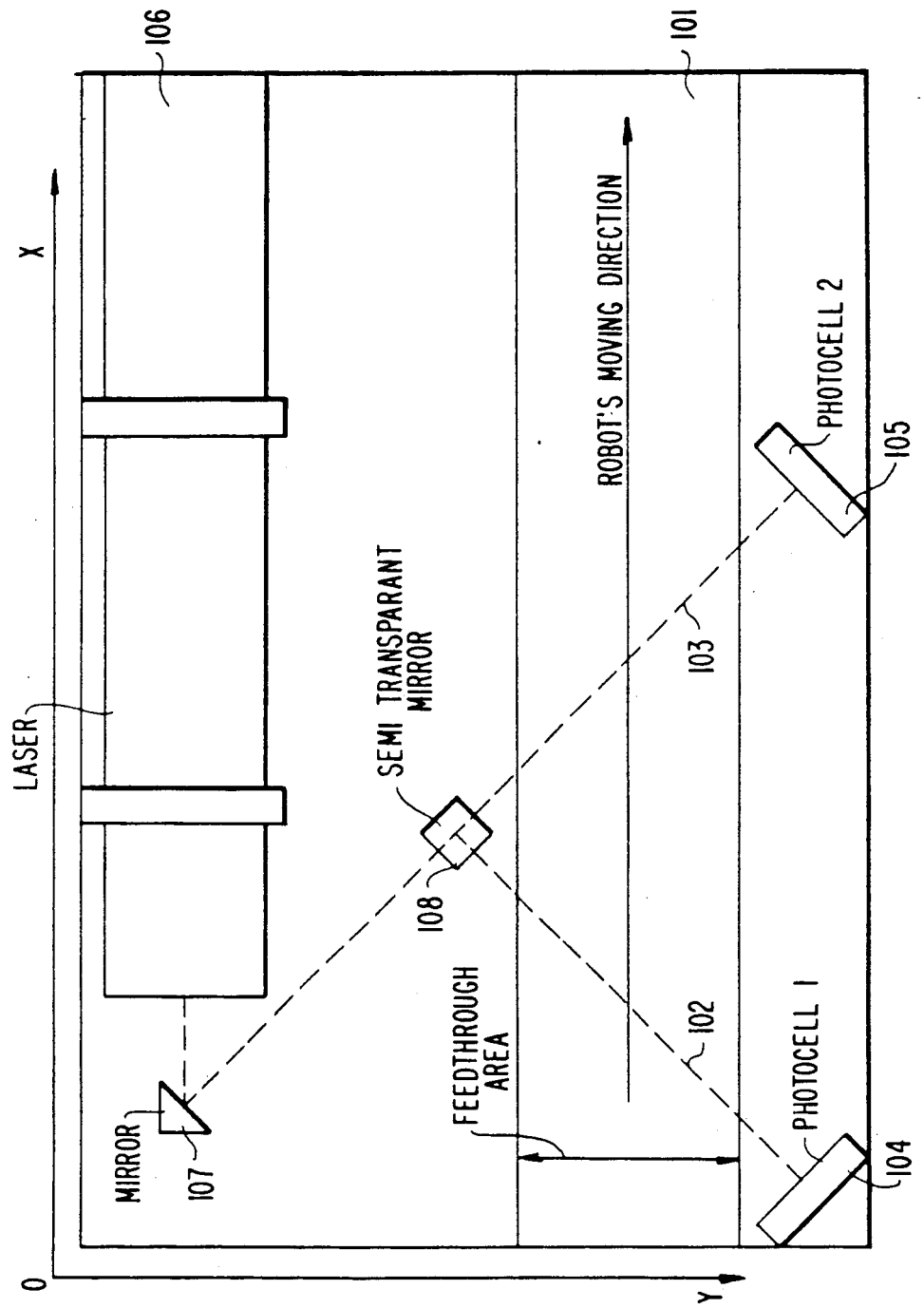
FIG. 1 illustrates a known system.
Figure 2A:
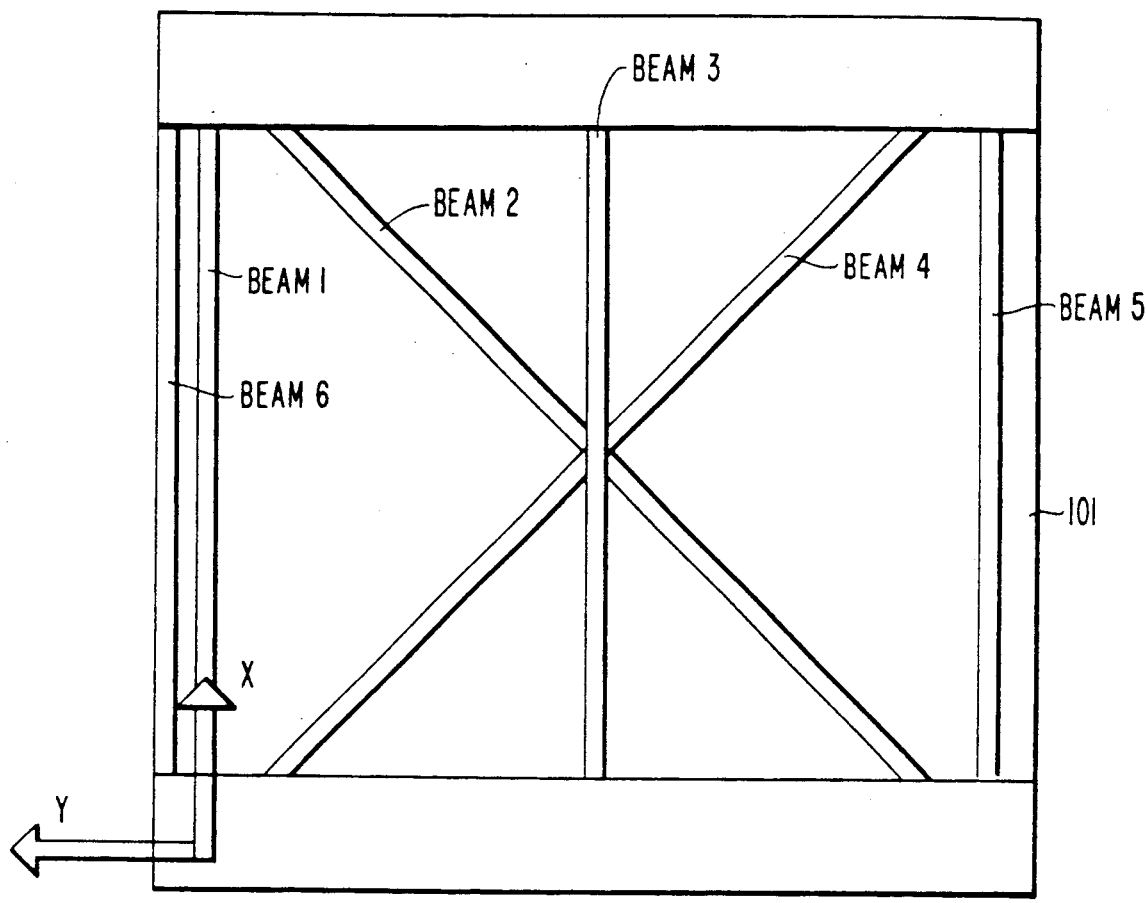
FIG. 2a is a plan view of beam layout in one embodiment of the invention.
Figure 2B:
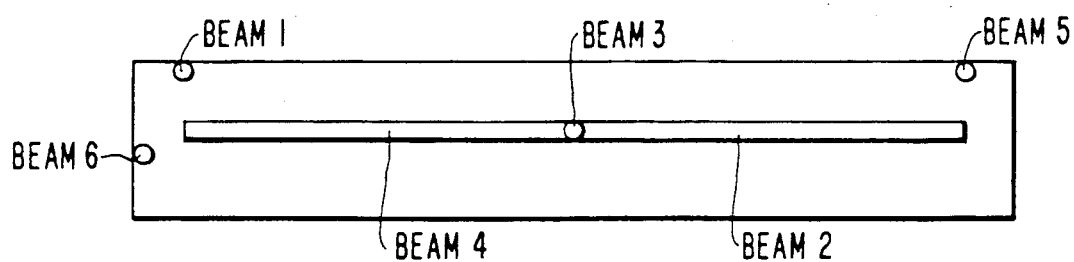
FIG. 2b is an elevation view of the beam layout of FIG. 2a, taken along the plane through the y-axis.

FIGS. 2a and 2b illustrate beam layout in one embodiment of the invention. In the figure, beams 2, 3, and 4 are used to measure lead locations. Beams 1 and 5 are used to measure velocity of the VOC during motion through the feedthrough area 101. Beams 1 and 5 therefore help eliminate the need to get data from the controller of the robot which carries the VOC. Beam 6 is used to determine if any of the leads on the VOC are too long. Beam 6 triggers an alarm function.

Each beam comprises a matched infrared LED/photodiode/thresholds amplifier pair with focusing lenses, such as the KEYENCE FU 36. These lenses create a very narrow beam more cheaply than would be possible using a laser. An alternative way of creating a narrow beam is to use a very narrow receiving area at the photodiode. The receiving area should be no wider than the leads of the component.

With this apparatus and geometry, lead measurement accuracy has been measured to be 0.1 mm. The maximum velocity of the component can be 400 mm/s.

FIG. 2a also shows two axes, x and y, which form the basis for a Cartesian coordinate system defined by the geometry of the sensor. The axes, x and y, do not have a physical existence, but merely serve as a reference frame for calculations. Each beam can be characterized by an equation of the form $$y = a_i x + b_i,$$

where i is an integer indicating the beam number. In other words, each beam is defined by a pair of parameters $(a_i, b_i)$.

Figure 3:
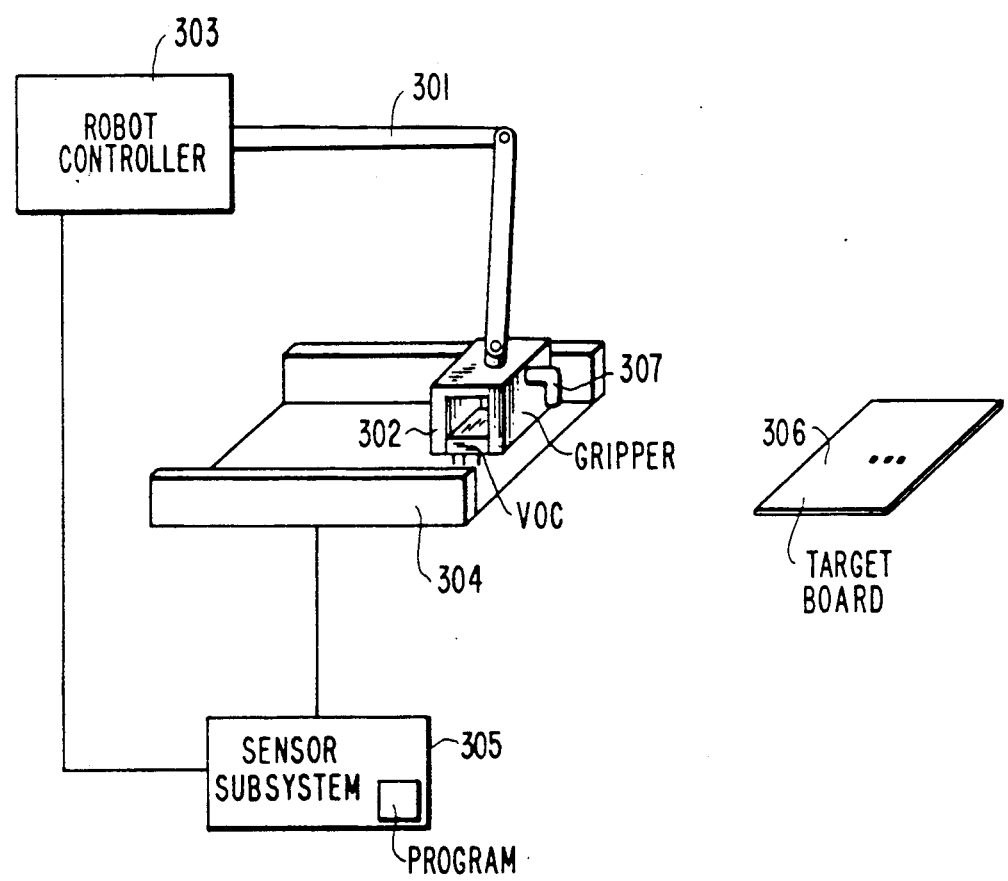
FIG. 3 shows an automated assembly system using the sensor.

FIG. 3 shows an assembly unit using the sensor. The assembly unit includes a robot arm 301 having a gripper in which is held the VOC. The gripper holds the body of the component. A tool 307 is a lead mounted on the robot gripper used to trigger all measurements and to measure velocity of the VOC during motion through the sensor feedthrough area. The robot controller 303 causes the robot arm to move the VOC through the sensor 304. The sensor subsystem 305, which is a computer, calculates the body-to-lead tolerances of the VOC, as the VOC passes through the sensor 304. The computer then sends data to the robot controller 303, which allows the robot controller to place the VOC in the target board 306.

Figure 4:
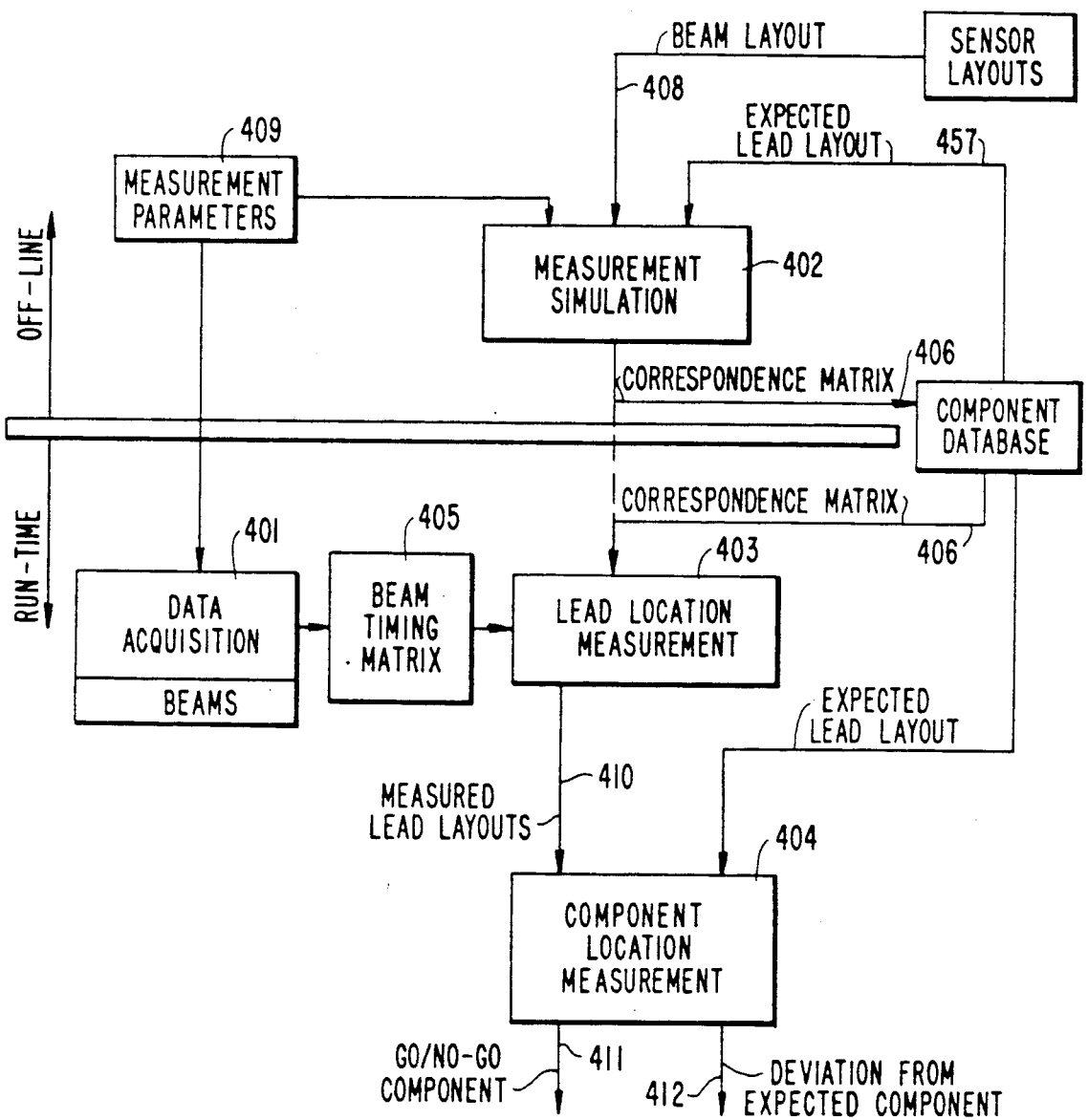
FIG. 4 is a flowchart of the software used by the sensor subsystem.

FIG. 4 is a flowchart of the software in the sensor subsystem. The software has four main functions: Data Acquisition 401, Measurement Simulation 402, Lead Location Measurement 403, and Component Location Measurement 404.

The Data Acquisition module 401 acquires measurement data and organizes it in a format that is convenient for the Lead Location Measurement module 403. First, the user provides measurement parameters. The module then enters a wait state until the tool 307 interrupts the first beam and the measurement is triggered. During data acquisition, the software continuously polls the output of the light beam photodiode amplifiers. The output for each beam is binary—beam is either OPEN or CLOSED. The six beam amplifier outputs are represented as a six-bit data word. The current value of that data word describes completely the current state of all the beams. The polling routine checks the data word to see if it changed state since the last time it was checked. If it did, the data word and an associated time stamp are stored in two respective arrays: a data array and a time stamp array.

The polling routine is the only software that has to run "real-time". Real-time in this context means that the polling loop has to run an order of magnitude faster than the response time of the photodiodes and amplifiers.

The software acquires data for a specified period. Over the entire measurement, each lead should interrupt each beam at most one time. Each interruption will cause a particular beam to change state two times from OPEN to CLOSED and from CLOSED to OPEN. The associated time are referred to herein as "tclose" and "topen", respectively. The data words stored in the data array are analyzed to determine which beam cause the interruption. The associated tclose and topen are used to calculate an estimate for the moment of interruption using the equation $$tavg = (tclose + topen)/2$$

and for the diameter of the lead using the equation $$tdiff = topen - tclose.$$

The times tavg and tdiff are stored in a beam timing matrix 405. Each row in the matrix contains a sequence of tavg's and tdiff's of interruptions of one beam. The tavg's are given in increasing value. The tdiff's are also stored in the matrix, to be used in calculation of lead thickness. The beam timing matrix 405 does not contain any information about which lead caused a specific interruption.

The software also measures the actual velocity of the gripper 302 when it moved through the sensor. The velocity is calculated by using the timing data from beam 1 and 5 interruptions caused by the tool 307. The orthogonal distance between the two beams divided by the difference in interruption times is used as an estimate for the gripper velocity "man_velocity".

The primary function of the Measurement Simulation module 402 is to provide the correspondence matrix 406. This matrix is required to interpret the beam timing matrix 405. The correspondence matrix 406 gives, for each tavg entry in the beam timing matrix 405, the lead number "leadnb" that caused that interruption.

The correspondence matrix 406 is derived with a simulation based on the expected lead layout 407, the beam layout 408, and the measurement parameters 4Og. Measurement parameters 409 include, for instance, expected gripper velocity and expected lead offsets. The expected moment "texp" of each lead beam interruption is determined from 407, 408, and 409, by calculating the travelling distance from the location at triggering until the interruption with the beam, and dividing this distance by the expected gripper velocity.

For each beam, the texp's are ranked in a sequence with increasing values. The sequence of corresponding leadnb's is stored as a row in the correspondence matrix 406.

The correspondence matrix 406 can be calculated off-line and stored as part of the component data base.

The Measurement Simulation module can be an interactive evaluation tool for lead layouts. It is not possible to measure all leads in some types of more complex components. The main reason for this is the shadowing effect: the light beam cannot see a particular lead because another lead is obstructing the view. The user has to evaluate expected lead-beam interruption times and check, for each beam, the time differences between consecutive leads. If this difference is small, chances are that one lead will obstruct the view of the other and that the lead location measurements for both leads will be unreliable. If lead location measurements are unreliable, a different angle, of the component with respect to the sensor, has to be selected by the user.

Individual lead locations are calculated in the Lead Location Measurement module. The system uses the three beams in the sensor plane to derive the lead locations ($x_{lead}$, $y_{lead}$). For each lead, three linear equations (with two unknowns) are constructed in the form.

$$y_{lead} = a_i * x_{lead} + b_i + tavg * man\_velocity \qquad (1)$$

where $i = 2,3,4$ and $a_i$ and $b_i$ are the beam parameters. Equations (1) are constructed from the beam timing 405 and correspondence 406 matrices. Each equation (1) represents a line and the lead location is at the intersection point of the three lines. However, because of measurement noise, the three lines will not intersect in a single point. The lead location is therefore estimated by calculating the average of the three intersection points of the three possible pairs of lines, i.e. (line1,line2), (line1,line3), and (line2,line3). The standard deviation of the average is also calculated and is used as a measure of accuracy for the lead location measurement.

The Component Location Measurement module 404 calculates the overall component location and verifies the component lead regularity. The measurement is based on a point pattern matching technique described in S. Lee et al., "A Fast Computational Method for Minimum Square Error Transform", Proc. 9th Int'l Conf. Pattern Recognition, (Rome, Italy, 11/88) pp. 392-394. In this paper, a computationally efficient method is described for the matching of two 2-D point patterns (with already established correspondence). The proposed algorithm is implemented and calculates rapidly the translation and rotation which, applied to one pattern, minimizes the sum of the squared distances between corresponding points in the two patterns.

One pattern, for the present software, is the expected lead layout 407 coming from the component database. The other pattern is the measured lead layout 4IO from the Lead Location Measurement module 403. The translation and rotation parameters are calculated relative to the expected lead layout 407. In this way, the controller 303 can apply the calculated translation and rotation, called "deviation from expected component" 412 directly to the component target location. If required, however, the translation and rotation parameters can be transformed easily to other coordinate systems.

In physical terms, a minimal cumulative squared distance between component leads and holes in a board does not guarantee that insertion is possible. A component can not be inserted successfully if one lead is bent too much, even though all other leads are perfect. If all leads are bent only a small amount, the component can be inserted although the cumulative squared distance might be the same or even bigger as in the one-bent-lead case. The Component Location Measurement module 404 therefore also calculates another measure called residual error for each lead: the distance between the transformed (i.e., translated and rotated) expected lead location and the measure lead location. This error is a measure for the local distortion of the lead pattern. The lead can not be inserted if the residual error of that lead is above a certain threshold. If desired, the user can specify different residual errors for different leads (for example when not all the holes have same dimensions). In the current implementation, the maximum of all residual errors of a component is compared with a user selectable threshold to make the go/no-go component decision 411. The residual error is calculated as described in the above-described paper of Lee et al. according to the following equations $$r_j = SQRT((x_{l-a,j} - x_{exp,j})^2 + (Y_{l-a,j} - Y_{exp,j})^2)$$

$$c = \sum_j r_j$$

where c is the cumulative residual error, $r_j$ is the residual error of the lead j, $x_{l-a,j}$ is the average of $x_{lead}$ for lead j, $x_{exp,j}$ is the expected x position of lead j, $y_{l-a,j}$ is the average of $y_{lead}$ for lead j, $y_{exp,j}$ is the expected position of lead j, and SQRT is the square root function.

Figure 5:
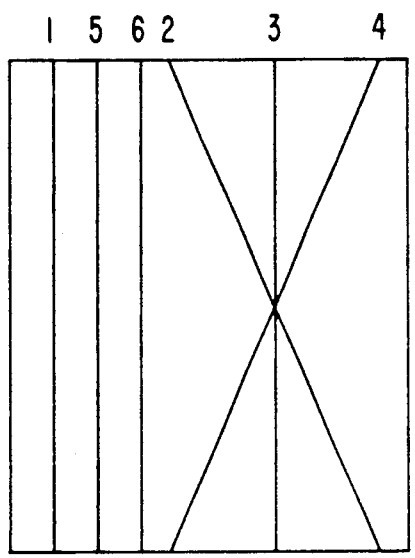
FIG. 5 is a plan view of an alternate beam layout according to the invention.

FIG. 5 shows an alternate beam layout according to the invention.

Figure 6:
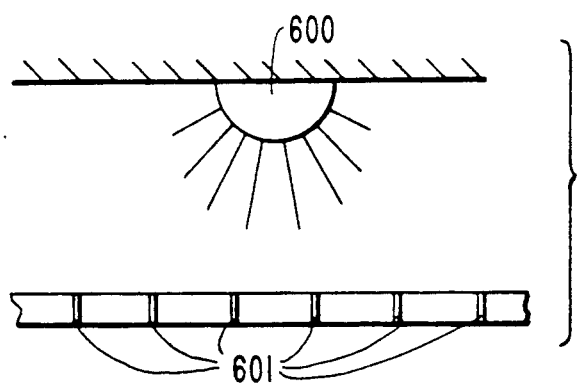
FIG. 6 is a second alternate beam layout according to the invention.

FIG. 6 shows an alternate embodiment in which there is a light source 600 which is multidirectional, and a plurality of sensors 601. Alternatively, one can use a single light source with a line scan camera.

FIG. 7 shows an alternate embodiment with another beam layout.

As shown in FIG. B, for additional accuracy, a dual or quad cell photodiode may be used for detecting light beams. Such photodiodes detect gradual interruption of a light beam as a lead passes in front. In conjunction with such photodiodes, a differential amplifier should be used rather than a threshold amplifier.

FIG. 8a shows a top view of measurement of a lead location using a dual dell diode. At position 801 to lead does not interrupt the light beam from LED 806 at all. At position 802, the lead interrupts the portion of the light beam in front of area 1, 807. At position 803, the lead interrupts the portions of the light beam which are in front of both the portion of the light beam which is only in front of area 2, 808. At position 805, the lead again does not interrupt the light beam at all. FIG. 8c is a front view of the two cell photodiode.

These interruptions of the light beams result in the amplifier signals from the photodiode shown in FIG. 8b. The zero crossing signals give accurate measurements of lead locations.

I claim:

1. Apparatus for sensing a position of a lead of a component comprising:
   (a) a sensor body defining a feedthrough area for allowing passage of the component;
   (b) at least three independent light sources in the sensor body;
   (c) means for receiving light from the light sources;
   (d) calculation means for
      (i) monitoring the means for receiving so that respective interruptions in all of the light sources are detected as the lead passes through the feedthrough area; and
      (ii) calculating a position of the lead based on the respective interruptions.

2. The apparatus of claim 1 wherein each light source comprises an LED and each receiving means comprises a photodiode.

3. The apparatus of claim 2 wherein the photodiode has a receiving area which is no wider than an expected width of a lead component.

4. The apparatus of claim 2 wherein the photodiode is a dual cell photodiode.

5. The apparatus of claim 2 wherein each receiving means further comprises a lens between the LED and the photodiode and a threshold transformer coupled to an output of the photodiode.

6. The apparatus of claim 1 wherein the at least three independent light sources comprise six independent light sources, so that, in conjunction with the receiving means and the calculating means,
   (a) first, second, and third light sources measure lead position,
   (b) fourth and fifth light sources measure a position of a robot carrying the component, and
   (c) a sixth light source measures lead length.

7. The apparatus of claim 1 wherein the calculating means calculates a position of a second lead, shadowed by the lead, based on inconsistencies in timings of the respective interruptions.

8. The apparatus of claim 7 wherein the component is a very odd component having leads in more than two parallel rows.

9. Apparatus for sensing a position of a lead of a component comprising;
   (a) a sensor body defining a feedthrough area for allowing passage of the component;
   (b) at least one light source in the sensor body;
   (c) means for receiving light from the light source;
   (d) means disposed within the sensor body for identifying a position of a robot carrying the component;
   (e) calculation means for
      (i) monitoring the means for receiving so that interruptions in the light source are detected as the lead passes through the feedthrough area; and
      (ii) calculating respective relative positions of the robot and the lead based on the interruptions and an output from the identifying means.

10. The apparatus of claim 9 wherein
    (a) the means for identifying comprises
       (ii) first and second LED's;
       (ii) first and second photodiodes for receiving light from the first and second LED's, respectively; and
    (b) the calculating means monitors outputs of the photodiodes and calculates a position of the robot therefrom.

11. The apparatus of claim 10 further comprising (a) first and second focusing lenses, the first focusing lens disposed between the first LED and the first photodiode and the second lens disposed between the second LED and the second photodiode; and (b) first and second thresholding amplifiers coupled to the outputs of the first and second photodiodes, respectively.

12. The apparatus of claim 10 wherein
(a) at least one of the photodiodes is a dual cell photodiode; and
(b) the calculating means calculates the position based on timing differences in the interruptions at the two cells.

13. The apparatus of claim 10 wherein
(a) at least one of the photodiodes is a quad cell photodiode; and
(b) the calculating means calculates the position based on timing differences in the interruptions at the four cells.

14. The apparatus of claim 9 wherein
(a) the means for identifying comprises
  (i) at least one additional light source; and
  (ii) at least one second means for receiving light from the additional light source; and
(b) the calculating means monitors an output of the second receiving means and calculates robot position therefrom.

15. The apparatus of claim 9 further comprising a robot controller for controlling the robot to place the component in a printed circuit board based on the relative positions, whereby the robot places the component based on the relative positions rather than an expected position.

16. Apparatus for sensing a position of a lead of a component comprising:
(a) a sensor body defining a feedthrough area for allowing passage of the component;
(b) at least one multidirectional light source in the sensor body;
(c) at least two independent light detectors in the sensor body, the light detectors each having a respective opening which has a width similar to a typical width of a lead of the component;
(d) calculating means for
  (i) monitoring the detectors so that interruptions in the light source are detected as the lead passes through the feedthrough area; and
  (ii) calculating a position of the lead based on the interruptions.

17. A method for directing a robot to place a component comprising the steps of:
(a) sensing a position of a robot carrying a component;

(b) sensing a layout of leads of the component;
(c) receiving data representing an expected layout of leads of the component;
(d) calculating translational and rotational differences between the sensed layout and expected layout; and
(d) transmitting the translational and rotational differences to a robot controller.

18. The method of claim 17 further comprising the step of sensing the velocity, man velocity, of the robot, where man velocity is a variable representing the velocity of the robot.

19. The method of claim 17 wherein step (b) comprises the steps of:
(a) polling outputs of at least two light beams;
(b) sensing interruptions in the light beams;
(c) representing each light beam, i, as a respective pair of parameter, $a_i$ and $b_i$, where i is an integer variable denoting the respective light beam, $a_i$ is a variable representing a slope of a line followed by the respective light beam, and $b_i$ is a variable representing the y-intercept of the line followed by the respective light beam;
(d) solving the equations $$y_{lead} = a_i x_{lead} + b_i + tavg * man\_velocity$$

where $x_{lead}$ and $y_{lead}$ are variables representing first and second coordinates, respectively, of a position of the lead, and tavg is a variable representing an average time of measurement of the interruptions; and
(e) averaging the values of $y_{lead}$ and averaging the values of $x_{lead}$ to obtain the positions of the leads.

20. The method of claim 17, wherein the method is part of a method for placing the component in a printed circuit board, and wherein the method further comprises the step of
placing the component in the printed circuit board, using the rotational and translational differences.

21. The method of claim 17, wherein the calculating step comprises
pattern matching an expected lead layout against a measured lead layout.

22. The method of claim 21, further comprising the step of calculating a residual error and cumulative residual error as a measure of integrity of the component and of the pattern matching step.

23. The method of claim 22 further comprising the steps of
(a) receiving a user selectable threshold for the residual and cumulative errors; and
(b) verifying component and pattern matching integrity against the user selectable threshold prior to component placement.

* * * * *